United States Patent
Murouchi et al.

(10) Patent No.: US 7,737,198 B2
(45) Date of Patent: Jun. 15, 2010

(54) WHOLLY AROMATIC LIQUID CRYSTAL POLYESTER RESIN MOLDED PRODUCT

(75) Inventors: Satoshi Murouchi, Yokohama (JP);
Toshio Nakayama, Kawasaki (JP);
Yoshikuni Yamada, Yokohama (JP)

(73) Assignee: Nippon Oil Corporation, Tokyo (JP)

( * ) Notice: Subject to any disclaimer, the term of this patent is extended or adjusted under 35 U.S.C. 154(b) by 763 days.

(21) Appl. No.: 10/519,046

(22) PCT Filed: Jun. 19, 2003

(86) PCT No.: PCT/JP03/07828
§ 371 (c)(1),
(2), (4) Date: Aug. 19, 2005

(87) PCT Pub. No.: WO04/000937
PCT Pub. Date: Dec. 31, 2003

(65) Prior Publication Data
US 2006/0047100 A1    Mar. 2, 2006

(30) Foreign Application Priority Data
Jun. 25, 2002  (JP) .............................. 2002-185354

(51) Int. Cl.
*C08J 9/32* (2006.01)

(52) U.S. Cl. ..................... 523/219; 428/35.7; 428/36.6; 428/474.4; 428/220; 428/421; 524/445; 524/430; 524/494

(58) Field of Classification Search ................. 424/486; 528/272, 294; 525/392; 430/137.15; 428/220, 428/421; 523/219; 524/494
See application file for complete search history.

(56) References Cited

U.S. PATENT DOCUMENTS

| 5,348,990 | A | * | 9/1994 | Walpita et al. | ............... | 523/219 |
| 5,767,223 | A | * | 6/1998 | Yamada et al. | ............... | 528/193 |
| 5,837,366 | A | * | 11/1998 | Tanaka | ........................ | 428/327 |
| 2001/0012862 | A1 | * | 8/2001 | Maeda | ........................ | 523/219 |
| 2007/0173565 | A1 | * | 7/2007 | Murouchi et al. | ........... | 523/218 |

OTHER PUBLICATIONS

Vectra LCP, Tincona Enigineering Polymers, http://www.tincona.com.br/home/portfolio/vectra.htm. Jan. 26, 2009.*

* cited by examiner

*Primary Examiner*—David R Sample
*Assistant Examiner*—Michael B Nelson
(74) *Attorney, Agent, or Firm*—Weingarten, Schurgin, Gagnebin & Lebovici LLP

(57) ABSTRACT

A molded product of a wholly aromatic liquid crystal polyester resin composition having a dielectric constant of 3.0 or less and a dielectric dissipation factor of 0.04 or less and is obtained by an injection molding of a composition comprising 90 to 45 percent by weight of the wholly aromatic liquid crystal polyester having a melting point of 320C or more, 10 to 40 percent by weight of an inorganic spherical hollow material having an aspect ratio of 2 or less, and 0 to 15 percent by weight of an inorganic filler having an aspect ratio of 4 or more. The molded product has dielectric properties suitable for information and telecommunications equipment, and is excellent in solder heat resistance, processability, and dimensional stability. The molded product is advantageous as a substrate material for use in information and telecommunications equipment such as a cellular mobile phone and as a fixing/holding member of a transmitter-receiver element.

8 Claims, No Drawings

WHOLLY AROMATIC LIQUID CRYSTAL POLYESTER RESIN MOLDED PRODUCT

This application is a 371 national phase filing of PCT/JP2003/007828 filed Jun. 19, 2003, and claims priority to a Japanese application No. 2002-185354 filed Jun. 25, 2002.

TECHNICAL FIELD

The present invention relates to a wholly aromatic liquid crystal polyester resin molded product. Furthermore, the present invention relates to a liquid crystal polyester resin molded product which is useful for a plastic component of telecommunications equipment employed in high frequency band regions such as microwaves and millimeter waves.

BACKGROUND ART

In recent years, a transmission amount of an information and a transfer velocity of the information and telecommunications equipment such as a personal computer and a cellular mobile phone have increased explosively with the development of the advanced information society. Especially, in a wireless communication system the applied frequency band shifts increasingly to a high frequency range by the requirement to higher speed and higher density communication.

In order to speed up the signal transmission velocity, the reduction of delaying time for the propagation of signals is an important subject, and therefore a reduced dielectric constant applied for the information and telecommunications equipment becomes indispensable. Also, in the high frequency range, since the high frequency has a property to lose by converting in the form of heat, in order to transmit electric signals effectively, a material having a small dielectric loss (dielectric constants $\in$×dielectric dissipation factor tan δ) is necessary so that a reduced dielectric constant of a material is, also, required in this respect.

Namely, for plastic components employed for the information and telecommunications equipment, as the electrical characteristics, low levels of the specific dielectric constant and the dielectric dissipation factor are given as important prescribed properties in addition to a solder heat resistance, processability, and dimensional stability. Especially, it is in a substrate material of the portable wireless telecommunications equipment and a fixing or a holding member of transmitter-receiver element that they are strongly demanded. Fluoroplastics and polyolefin are known as plastic materials having especially low level of the relative dielectric constant where, for example, the relative dielectric constants of Teflon® (trade name) and of polypropylene are approximately 2 and approximately 2.4, respectively. However, those plastics have problems with heat resistance, processability and mechanical properties so that the development of plastic materials having the dielectric properties combined with those various properties simultaneously is demanded. On the other hand, the recent further downsizing and weight saving requirement for electronic equipments are demanded more strongly and also, a heat resistance capable of coping with a reflow method which improves packaging density of component in printed-wiring assembly substrate surface is required.

Liquid polyester resins have good processability, excellent dimensional stability, and high heat resistance which is tolerable to the solder reflow compared with other general plastics, and have ideal characteristics as materials for electronic and electrical components. However, most of the conventional liquid polyesters provide the dielectric constant having 3.0 or more, and even if 3.0 or less, the liquid polyesters and liquid polyesters compound having an excellent balance of processability, heat resistance, reduced dielectric constant, and reduced dielectric dissipation factor to satisfy the requirement of the above mentioned electronic and electrical industrial fields have been unknown.

A molded product of liquid polyester is made generally from a composition compounded with inorganic fillers and the dielectric dissipation factor improves by compounding general fillers while the relative dielectric constant increases. In order to decrease the relative dielectric constant of the molded product, a method is considered to compound spherical hollow material fillers containing air which has the reduced dielectric constant. However, if the product for electronic part having a portion of thickness less than 0.5 mm is produced by injection molding method, compounded hollow filler may be destroyed so that the compounded effect is deprived and the improvement effect of the relative dielectric constant is reduced.

An object of the present invention is to provide the molded product, which has the dielectric property that the conventional liquid crystal polyester has not realized, which simultaneously keeps the heat resistance property such as solder reflow of the liquid crystal polyester, and which is used in the information and telecommunications equipment employed in high frequency band ranges such as microwaves and millimeter waves.

SUMMARY OF THE INVENTION

The first point of the present invention relates to a molded product comprising a dielectric constant of 3.0 or less and a dielectric dissipation factor of 0.04 or less obtained by the injection molding of a wholly aromatic liquid crystal polyester resin composition which comprises 45 to 90 percent by weight of a wholly aromatic liquid crystal polyester having a melting point of 320° C. or more, 10 to 40 percent by weight of an inorganic spherical hollow material having an aspect ratio of 2 or less, and 0 to 15 percent by weight (100 percent by weight in total) an inorganic filler having an aspect ratio of 4 or more.

The second point of the present invention comprises the molded product according to the first point, wherein said wholly aromatic liquid crystal polyester is prepared by the polycondensation of 80 to 100 percent by mole of p-hydroxybenzoic acid (I), terephthalic acid (II), and 4,4'-dihydroxydiphenyl (III) (including the derivatives) (provided that a total of (I) and (II) is made more than 60 mole percent) and 0 to 20 percent by mole of other aromatic compound which can conduct a decondensation reaction with any one of (I), (II), or (III).

The third point of the present invention comprises said molded product, wherein an apparent viscosity at a melting point +20° C. of said wholly aromatic liquid crystal polyester is 5,000 poise or less.

The fourth point of the present invention comprises said molded product wherein the above mentioned inorganic spherical hollow material having an aspect ratio of 2 or less is an average particle diameter of 5 to 200 μm and a rate of volume hollowness of 50 percent or more.

The fifth point of the present invention comprises said molded product, wherein the inorganic filler having the aspect ratio of 4 or more is a glass fiber having an average diameter of 20 μm or less and/or a talc having an average particle diameter of 100 μm or less and additionally the weight percent is in a range of 5 to 15.

The sixth point of the present invention comprises that said molded product contains a portion of thickness 0.5 mm or less and that a relative dielectric constant of said portion is 3 or less.

The seventh point of the present invention relates to the portable wireless telecommunications equipment having said molded product as a fixing or a holding member of the transmitting and receiving component.

DETAILED DESCRIPTION OF THE PREFERRED EMBODIMENT

The present invention is described in detail as follows. A wholly aromatic liquid crystal polyester applied in the present invention is a polyester which is generally called thermotropic liquid crystal polymer and which forms an anisotropic melt. The liquid polyester of the present invention is the resin having the melting point of 320° C. or more. The melting point is defined as an endothermic peak which is detected by a differential scanning calorimeter and the measurement method is described as follows, namely where the endothermic peak Tm1 of the polymer is obtained by melting under a raising temperature rate of 20° C./minute starting from the room temperature and the molten polymer is cooled to 150° C. under a cooling rate of 10° C./minute, and then the endothermic peak Tm2 is obtained when the temperature is raised under the raising temperature rate of 20° C./minute and the Tm2 is defined as the melting point. The melting point having 320° C. or more is defined as the endothermic peak which is detected at least in the range of 320° C. or more, and individual peaks detected under 320° C. provide no problem. Polymers in case of having the melting point under 320° C. are not preferable since a reduced heat resistance is not tolerable for a soldering process.

As the structural units of the liquid crystal polyester applied in the present invention, examples include, a resin comprising a combination of an aromatic dicarboxylic acid, an aromatic diol and an aromatic hydroxycarboxylic acid; a resin comprising a different aromatic hydroxycarboxylic acid; a resin comprising a combination of an aromatic dicarboxylic acid and an aromatic diol; a resin formed by reacting a polyester such as polyethylene terephthalate or the like with an aromatic hydroxycarboxylic acid and the like are given, and namely the structural units include as follows.

Structural units derived from aromatic hydroxycarboxylic acids:

[formula 1]

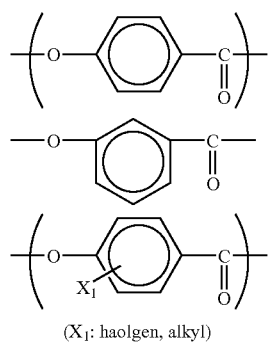

($X_1$: haolgen, alkyl)

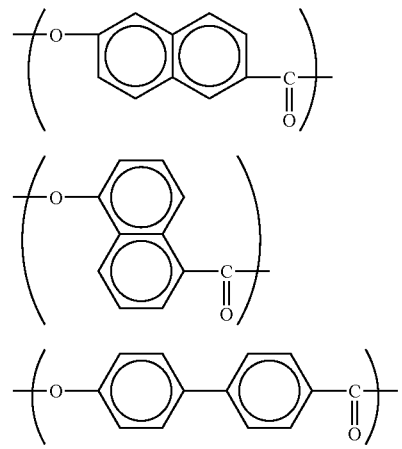

Structural units derived from aromatic dicarboxylic acids:

[formula 2]

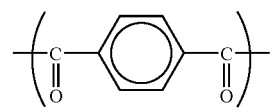

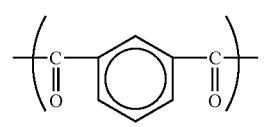

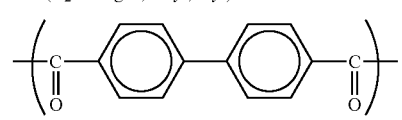

($X_2$: halogen, alkyl, aryl)

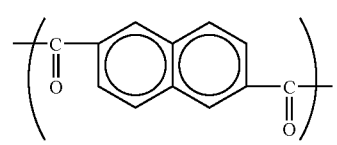

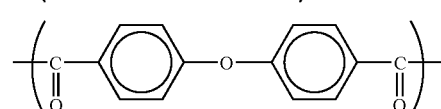

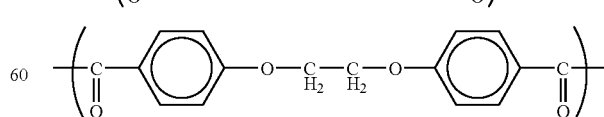

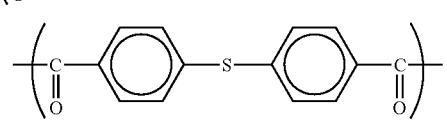

Structural units derived from aromatic diols:

[formula 3]

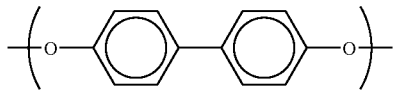

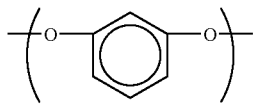

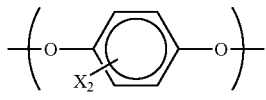

($X_2$: halogen, alkyl, or aryl)

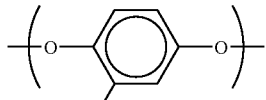

($X_3$: halogen, alkyl, or aryl)

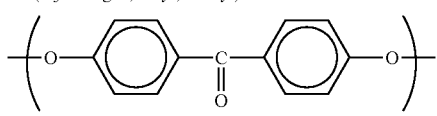

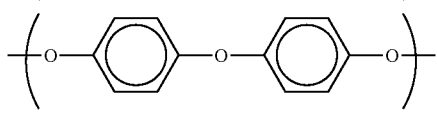

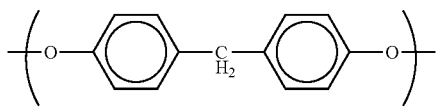

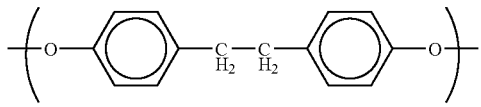

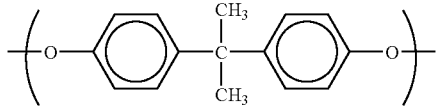

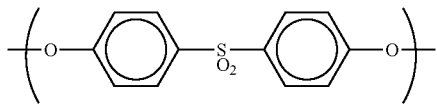

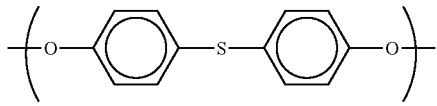

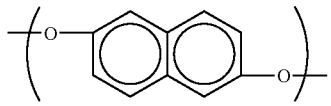

($C_1$) 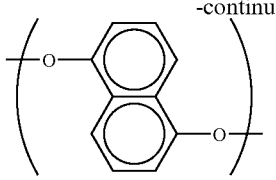

($C_2$)

($C_3$) 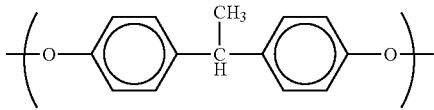

The liquid crystal polyester which is preferable from the stand point of balance between heat resistance, mechanical property and processability is the resin which contains the above mentioned structural unit represented by ($A_1$) in an amount of at least 30 percent by mol, and more preferably by a total of ($A_1$) and ($B_1$) in an amount of at least 60 percent by mol. By fulfilling the above conditions an inflexibility of the molecular structure is acquired and an excess stress which is provided while melt mixing by a twin-screw extruder and the like and while molding by an injection machine is eliminated so that fractures of hollow materials can be reduced. Also, by decreasing a latent heat of fusion of crystalline part, since a quantity of heat required to melt reduces and the resin easily changes to molten state, not many inorganic spherical hollow materials are fractured in the melt extrusion process under heating. Moreover, by applying the polyester having an apparent viscosity of 5,000 poise or less at the melting point +20° C. of the liquid crystal polyester, the effect can be ensured more.

Furthermore, combinations of the above structural units, ($A_1$), ($B_1$), ($C_1$)
($A_1$), ($B_1$), ($B_2$), ($C_1$)
($A_1$), ($B_1$), ($B_2$), ($C_2$)
($A_1$), ($B_1$), ($B_3$), ($C_1$)
($A_1$), ($B_1$), ($B_3$), ($C_2$)
($A_1$), ($B_1$), ($B_2$), ($C_1$), ($C_2$)
($A_1$), ($A_2$), ($B_1$), ($C_1$)

are preferable, and as more preferable monomer composition, the aromatic polyester is prepared by the polycondensation of 80 to 100 percent by mole of p-hydroxy benzoic acid, terephthalic acid, and 4,4'-dihydroxydiphenyl (including the derivatives), and of 0 to 20 percent by mole of the aromatic compound which is selected from a group other than the above aromatic diol, aromatic hydroxydicarbon acid, and aromatic dicarboxylic acids(total of both to make 100 percent by mole). 80 percent by mol or less of p-hydroxy benzoic acid, terephthalic acid, and 4,4'-dihydroxydiphenyl are not preferable because of a reduced heat resistance.

Known methods can be adopted for preparation methods of liquid crystal polyester resins used in the present invention. Production methods can be applied by a melt polymerization or by a two-stage polymerization with a melt polymerization and a solid polymerization. As a concrete example, monomers, selected from aromatic dihydroxy compound, aromatic dihydroxycarboxylic acid and aromatic dicarboxylic acid, are fed into a reactor, and after hydroxyl group of monomer is acetylated by an introduction of acetic anhydride, resins are produced by deacetic acid polycondensation reaction. For example, a polyester production method is given where p-hydroxy benzoic acid, terephthalic acid, isophthalic acid, and 4,4'-biphenyl are introduced into the reactor in the nitrogen gas atmosphere and acetic anhydride is added to conduct acetoxylation while refluxing acetic anhydride, and then deacetic acid melt polycondensation is proceeded during distilling acetic acid by raising in temperature in the range of 150 to 350° C. Polymerization time can be selected in the range of 1 hour to several tens of hours. In the production of the thermotropic liquid crystal polyester of the present invention, prior to the production, drying of monomers may or may not be conducted.

In case that further solid phase polymerization is proceeded to the polymer obtained by the melt polymerization, after the polymer obtained by the melt polymerization is solidified and subsequently the polymer is ground to make powder or flake form, by the known solid polymerization methos, for example, thermal treatment is conducted in the temperature range of 200 to 350° C. for 1 to 30 hours in the inactive atmosphere such as the nitrogen gas. The solid phase polymerization may proceed under the agitation or the stilled state without agitation.

In the polymerization reaction, catalysts may or may not be used. As catalysts for use, the conventional known catalysts used as polyester polycondensation catalysts can be applied, namely metallic salts such as magnesium acetate, stannous acetate, tetra butyl titanate, lead acetate, sodium acetate, potassium acetate, antimony trioxide and organic compound catalysts such as N-methyl imidazole.

Also, polymerization vessels for the melt polymerization is not limited specifically and agitators generally applied for high viscous reactions are recommended to select from various types such as anchor type, multi-stage type, spiral belt type, spiral axis type and agitator tank type polymerization vessels having the modified types of agitators, namely Werner type mixer, Banbury mixer, pony mixer, muller mixer, roll mill, continuously controllable Ko-kneader, pug mill, gear compounder. Examples of inorganic spherical hollow materials comprise inorganic materials such as alumina, silica, zirconia, magnesia, glass, Shirasu, fly ash, borate, phosphate, ceramic and the like. When the inorganic spherical hollow materials disperse in the molded product, the molded product becomes to contain apparent micro bubbles so that the relative dielectric constant is reduced. Since the hollow materials are inevitable to break by receiving stress histories during composition production process and/or molding process, having high strength is preferable, but seeking high strength leads to adopt a high density material which causes a heavy molded product and the commercial value of the molded product is sometimes reduced. In case of considering for the application to electronic parts, from the stand point of balance, micro hollow materials so called glass balloon, Shirasu balloon, and ceramic balloon are preferably given, and the glass balloon is the most preferable material.

Furthermore, an aspect ratio of the inorganic spherical hollow material is 2 or less. The aspect ratio of exceeding 2 is not preferable since a hollow material is easily broken. The micro spherical hollow material in the present invention is preferable to have the average particle diameter of 5 to 200 μm, and specifically preferable of 10 to 100 μm. Also the rate of volume hollowness of the micro hollow material is preferable to be 50 percent or more for the reduced relative dielectric constant and the improvement of the dielectric loss, and 80 percent or less is preferable for a rate of fracture control. The rate of volume hollowness can be derived as 100×(1−true specific gravity of micro hollow material/material specific gravity of micro hollow material).

The above mentioned particle diameter and the rate of volume hollowness are not preferable to be out of the range, since the hollow part existing in the composition is reduced so that a decrease effect for the relative dielectric constant is reduced. Also, a low level of a reduced effect of the relative dielectric constant is not preferable, even though a dielectric dissipation factor shows the appropriate value, since the improvement of the dielectric loss can not be found consequently. Examples include Glass bubbles (Trade name: Scotch Light S-60) manufactured by Sumitomo 3M Limited, and glass micro hollow material (Trade name: Cel StarPZ-6000) manufactured by Tokai Kogyo Co. Ltd. If required, in order to improve adhesiveness to the thermotropic liquid crystal polyester resins, a silane coupling agent can be Inorganic spherical hollow material being added under 10 percent by weight does not provide an improvement effect on the relative dielectric constant and the dielectric dissipation factor of the molded product, while 40 percent by weight and more is not preferable since a reduction occurs in mechanical strength of the molded product and in flowability of resin composition while molding.

In case that the higher rigidity of the molded product in the present invention is required, depending on a requirement, the inorganic filler having the aspect ratio 4 or more can be added up to 15 percent by weight (Total of said wholly aromatic liquid crystal polyester and said inorganic spherical hollow material is 100 percent by weight.). An excess of 15 percent by weight is not preferable since a reduced flowability occurs, and while the melt mixing and the injection molding, the internal stress increases so that the inorganic spherical hollow material is possibly fractured. Examples of the inorganic fillers having the aspect ratio of 4 and more used in the present invention include glass fibers, asbestos fibers, silica fibers, silica alumina fibers, potassium titanate fibers, carbon or graphite fibers; and metallic fibrous materials such as aluminum, titan and copper; and talc, mica, glass flake, and wollastonite.

Among them, adding 5 to 15 percent by weight of glass fibers having the average particle size of 20 μm or less and the talc having average particle size of 100 μm provides excellent balanced wholly aromatic liquid crystal polyester resin composition.

In the present invention, other fillers which do not inhibit the effect in said range include, for example, carbon black, graphite; and silicate esters such as silica, ground quartz, glass beads, ground glass, potassium silicate, aluminum silicate; talc, clay, diatomaceous earth; iron oxide, titanium oxide, zinc oxide, antimony trioxide, alumina, calcium sulfate; other various metallic powders; various metallic foils; and organic fillers as heat resistant high strength fiber, such as fluoroplastics, aromatic polyester, aromatic polyimide, polyamide.

Moreover, required characteristics can be given by the addition of general additives or other thermoplastic resins to the composition of the present invention within the range which does not damage the purpose of the present invention, such as antioxidants and thermal stabilizers (e.g. hindered phenolics, hydroquinone, phosphates and their substituted products and the like); UV absorbers(e.g. resolucinol, salicylate, benzotriazole, benzophenone and the like); slip agents and mold release agents (montanic acid and the salt, and the ester, and the half ester; stearyl alcohol, stearamide, and polyethylene wax and the like); coloring agents including dye (e.g. nigrosine and the like), and pigments (e.g. cadmium sulfide, phthalocyanine, carbonblack and the like); plasticizers; antistatic agents; flame retardants.

There is no specific restriction for the production method of compositions for wholly aromatic liquid crystal polyester resin molded products. Preferably by extruders having a pair of double-flight in screw, a method is preferable that after the liquid crystal polyester which is fed from a hopper is melted, the inorganic spherical hollow material is fed into a feed gate which is positioned in the half way. They are called twin-screw extruders among which are preferable to be co-rotating type that is possible to make uniform dispersion of the inorganic spherical hollow material by having self-wiping mechanism, to have a large space between barrel and screw with cylinder diameter of 40 mm ϕ or more to make easy bite of the inorganic spherical hollow material, and to be the intermeshing rate of 1.45 or more between barrel-screw.

The molded product obtained from the above mentioned liquid crystal resin composition by the injection molding provides excellent heat resistance, processability, mechanical property and dielectric property, and is useful for plastics materials applied for information and telecommunications equipment used for the high frequency band. Examples include high frequency relay, high frequency connector, high frequency transmittance circuit, high frequency printed wiring assembly, antenna for portable phone, sensor, and high frequency element. High frequency elements as examples include inductance element, capacitor element, transistor, amplification element, switch, filter, condenser, diode, thermistor, thyristor, oil, trance, resonance equipment, resistor, impedance element and the like.

EXAMPLES

The present invention will be described in reference to Examples and Comparative Examples, which should not be construed as a limitation upon the scope of the invention.

Measurement methods and evaluation methods of performance in Examples and Comparative Examples will be described as follows.

(1) Relative Dielectric Constant and Dielectric Dissipation Factor

A molded test piece of a size 60 mm×60 mm×1 mm using the injection molding machine UH-1000, manufactured by Nissei Plastic Industrial Co., Ltd. is subjected to the measurement using an impedance analyzer (4192A), manufactured by Yokogawa Hewlett Packard Co., Ltd. at 23° C., 1 MHz in accordance with ASTM D150.

(2) Melting Point

A melting point is subjected to the measurement by a differential scanning calorimeter (Seiko Instrument Inc.) with α-alumina as a reference. As the measurement temperature condition, an endothermic peak, obtained by melting a polymer under raising a temperature rate at 20° C./minute starting from the room temperature, is defined as Tm1 and the molten polymer is cooled to 150° C. under a cooling rate of 10° C./minute, and then the endothermic peak Tm2 is obtained when the temperature is raised under a raising temperature rate of 20° C./minute and the Tm2 is defined as the melting point.

(3) Evaluation of Flowability

A molded product is molded by using a mold of rectangle type molded product of 8 mm (width)×25 mm (length)×0.2 mm (thickness) size, with the injection molding machine UH-1000, manufactured by Nissei Plastic Industrial Co., Ltd. to mold under the pressure condition of 800 Kg/cm² to the longitudinal direction. The molded product which is able to be filled completely is evaluated as O and which is occurred a short shot is evaluated as X.

(4) Surface Property of Molded Product

The surface of 60 mm×60 mm×1 mm plain molded product obtained by the injection molding machine UH-1000, manufactured by Nissei Plastic Industrial Co., Ltd. is visually observed and the molded product having a plain surface is evaluated as O and having a non-plain surface as X.

(5) Soldering Heat Resistance 1 mm thick dumbbell according to ASTM1822 is molded by the injection molding machine MIN7, manufactured by Niigata Engineering Co., Ltd. and the maximum temperature which a deformation or a warpage is not observed by dipping to soldering bath at a certain temperature is treated as a soldering heat resistance temperature.

(6) Percent by Weight of Non-Fractured Inorganic Spherical Hollow Material

Percent by weight of the non-fractured inorganic spherical hollow material is obtained by the following equation (a).

$$\rho = 100/[\alpha/\rho1 + \beta/\rho2 + \gamma(1-X)/\rho3 + \gamma X/\rho4]- \quad (a)$$

α: Percent by weight of wholly aromatic liquid crystal polyester resin

β: Percent by weight of inorganic filler having aspect ratio 4 or more

γ: Percent by weight of inorganic spherical hollow material having aspect ratio 2 or less ρ: Specific gravity of wholly aromatic liquid crystal polyester resin composition ρ1: Specific gravity of wholly aromatic liquid crystal polyester resin ρ2: Specific gravity of inorganic filler having aspect ratio 4 or more ρ3: True specific gravity of inorganic spherical hollow material having aspect ratio 2 or less ρ4: Material specific gravity of inorganic spherical hollow material where;

X: Fracture rate of inorganic spherical hollow material

γ(1-X): Percent by weight of not-fractured inorganic spherical hollow material

γX: Percent by weight of fractured inorganic spherical hollow material

Production examples of wholly aromatic liquid crystal polyester resins will be described as follows.

Production of Liquid Crystal Polyester A:

P-hydroxybenzoic acid 1330.1 g (9.63 mol), p,p'-bisphenol 567.7 g (3.21 mol), tere-phthalic acid 453.5 g (2.73 mol), and isophthalic acid 79.7 g (0.48 mol) are fed into a 6 L polymerization reactor made by SUS316 as material (manufactured by Nitto kouatsu Co., Ltd.) and equipped with a double-helical agitator, and after having replacement with the nitrogen gas by conducting a vacuum-nitrogen gas purge repeating for two times, acetic anhydride 173.9 g (17.0 mol) is added, and an acetilation reaction is carried out to raise in temperature up to 150° C. in one hour with the agitating speed of 100 rpm and then for 2 hours under refluxing state. After the acetilation reaction, the polymer is discharged from the bottom of the reactor discharge gate, conducting in acetic acid distilling state and raising the temperature with a rate 0.5° C./minute to 330° C. The discharged polymer is ground to 20 mesh or less by a grinder and the solid phase polymerization is carried out by a heating device (Asahi Fiber Glass Co., Ltd.) equipped with a cylindrical rotational reactor. The powdered polymer is fed to the cylindrical rotational reactor, and while the nitrogen gas is flown at a flow rate of 1 liter/minute, the powdered polymer in the cylindrical rotational reactor is raised in temperature to 280° C. with taking 2 hours at 20 rpm and held for 3 hours at 280° C., and then raised in temperature to 300° C. in 30 minutes and held for 3 hours at 300° C., and raised in temperature to 310° C. in 30 minutes and held for 3 hours, and then the polymer is obtained by cooling to the room temperature in 1 hour. The obtained polymer has the melting point of 378° C. and the optical anisotropy at melting state is observed by a polarized microscope at 400° C.

Production of Liquid Crystal Polyester B:

p-acetoxybenzoic acid 810 g (4.50 mol) and 6-acetoxynaphthoic acid 690 g (3.00 mol), are fed into a 6 L reactor for polymerization made by SUS316 as a material (manufactured by Nitto kouatsu Co., Ltd.) and equipped with a double helical agitator, and after having replacement with the nitrogen gas by conducting a vacuum-nitrogen gas purge repeating for two times, the temperature is raised to 300° C. in 2 hours at agitating speed of 100 rpm by an agitator and after polymerization is conducted for 30 minutes at 300° C., and for 30 minutes at 320° C., and then for 2 hours at 320° C. under depressurized pressure condition at 8.0 torr, the reactant mixture is discharged from the system and ground to 20 mesh or less by a grinder. The solid phase polymerization is carried out by a heating device (Asahi Fiber Glass Co., Ltd.) equipped with a cylindrical rotational reactor. The powdered polymer is fed to the cylindrical rotational reactor, and while the nitrogen gas is flown at a flow rate of 1 liter/minute, a liquid crystal polyester is obtained by treating 5 hours at 240° C. at agitating speed of 20 rpm. The obtained polymer has a melting point of 281° C. and optical anisotropy at a melting state is observed by a polarized microscope at 320° C.

The fillers used in Examples and Comparative Examples are described as follows.
(1) Inorganic spherical hollow material A: S-60, manufactured by Sumitomo 3M Limited, (an aspect ratio 1, an average particle diameter 30 μm, a true specific gravity 0.60, a material specific gravity 2.50).
(2) Inorganic spherical hollow material B: PZ-6000, manufactured by Tokai Kogyo Co., Ltd. (an aspect ratio 1, an average particle diameter 40 μm, a true specific gravity 0.75, a material specific gravity 2.50)
(3) Glass fiber (Chopped glass fiber): PX-1, manufactured by Asahi Fiber Glass Co., Ltd. (an aspect ratio 350, an average fiber diameter 10 μm, an average fiber length 3.5 mm, a specific gravity 2.54)
(4) Talc: MSKY, manufactured by Nippon Talc Co., Ltd. (an aspect ratio 7, an average particle diameter 24 μm, a specific gravity 2.77)

Example 1

By using a twin-screw extruder KTX-46, manufactured by Kobe Steel Co., Ltd., having a cylinder diameter of 46 mmφ, at the cylinder maximum temperature 400° C., a liquid crystal polyester A 80 percent by weight is fed from the uppermost stream portion, and an inorganic spherical hollow material A 20 percent by weight is fed from the down stream portion and pellets are obtained by conducting a melt extrusion. At this case a rate of extrusion is 100 kg/hour. Various test pieces are molded at a cylinder temperature of 390° C. and measurements are conducted.

Example 2

The liquid crystal polyester A 70 percent by weight and the inorganic spherical hollow material A 30 percent by weight are melt-extruded by the extruder in accordance with Example 1 to obtain the pellets and measurements are conducted by the molded test pieces.

Example 3

By using the extruder in accordance with Example 1, the liquid crystal polyester A 80 percent by weight and a glass fiber 5 percent by weight are fed from the uppermost stream portion, and the inorganic spherical hollow material A 15 percent by weight is fed from the down stream portion and the pellets are obtained by conducting a melt extrusion and the various test pieces are molded and the measurements are conducted in accordance with Example 1.

Example 4

By using the extruder in accordance with Example 1, the liquid crystal polyester A 60 percent by weight and the glass fiber 8 percent by weight are fed from the uppermost stream portion, and the inorganic spherical hollow material A 32 percent by weight is fed from the down stream portion and the pellets are obtained by conducting a melt extrusion and the various test pieces are molded and the measurements are conducted in accordance with Example 1.

Example 5

By using the extruder in accordance with Example 1, the liquid crystal polyester A 60 percent by weight and a talc 8 percent by weight are fed from the uppermost stream portion, and the inorganic spherical hollow material A 32 percent by weight is fed from the down stream portion and the pellets are obtained by conducting the melt extrusion and the various test pieces are molded and the measurements are conducted in accordance with Example 1.

Example 6

The liquid crystal polyester A 60 percent by weight and the inorganic spherical hollow material A 40 percent by weight are melt-extruded in accordance with Example 1 to obtain the pellets and the measurements are conducted by the molded test pieces.

Comparative Example 1

The liquid crystal polyester A 40 percent by weight and the inorganic spherical hollow material A 60 percent by weight are melt-extruded in accordance with Example 1 to obtain the pellets and the measurements are conducted by the molded test pieces.

Comparative Example 2

The liquid crystal polyester A 100 percent by weight and the talc 8 percent by weight are fed from the uppermost stream portion and the pellets are obtained by conducting the melt extrusion and the various test pieces are molded and the measurements are conducted in accordance with Example 1.

Comparative Example 3

The liquid crystal polyester A 70 percent by weight and the inorganic spherical hollow material A 30 percent by weight are mixed with a ribbon blender and the mixture is fed from the uppermost stream to obtain the pellets by the melt extrusion and the measurements are conducted by the molded test pieces in accordance with Example 1.

Comparative Example 4

By using the extruder in accordance with Example 1, at the cylinder maximum temperature 320° C., the liquid crystal polyester A 70 percent by weight is fed from the uppermost stream portion, and the inorganic spherical hollow material A 30 percent by weight is fed from the down stream portion to obtain the pellets. The rate of extrusion, in this case, is 100 kg/hour. The various test pieces are molded at a cylinder temperature of 300° C. and the measurements are conducted.

Comparative Example 5

The liquid crystal polyester A 70 percent by weight and the glass fibers 30 percent by weight are mixed with the ribbon blender and the mixture is fed from the uppermost stream to obtain the pellets by the melt extrusion and the measurements are conducted by the molded test pieces in accordance with Example 1.

Comparative Example 6

The liquid crystal polyester A 70 percent by weight and the talc 30 percent by weight are mixed with the ribbon blender and the mixture is fed from the uppermost stream to obtain the pellets by the melt extrusion and the measurements are conducted by the molded test pieces in accordance with Example 1.

In Table 1, compositions ratios of Examples and Comparative Examples and in Table 2, evaluation results of Examples and Comparative Examples are shown, respectively.

TABLE 1

| | Liquid Crystal Polyester (wt %) | | Micro Hollow Sphere C (wt %) | | Fillers Other Than Micro Hollow Material D (wt %) | |
|---|---|---|---|---|---|---|
| | A | B | A | B | Glass fiber | Talc |
| Example 1 | 80 | | 20 | | | |
| Example 2 | 70 | | 30 | | | |
| Example 3 | 80 | | 15 | | 5 | |
| Example 4 | 60 | | 32 | | 8 | |
| Example 5 | 60 | | 32 | | | 8 |
| Example 6 | 60 | | | 40 | | |
| Comparative Example 1 | 40 | | 60 | | | |
| Comparative Example 2 | 100 | | | | | |
| Comparative Example 3 | 70 | | | | 30 | |
| Comparative Example 4 | | 70 | 30 | | | |
| Comparative Example 5 | 70 | | | | 30 | |
| Comparative Example 6 | 70 | | | | | 30 | over, the product having a thickness portion of 0.5 mm or less according to the flowability evaluation test is possible to mold by the injection molding. Also, the soldering heat resistance and the surface property of the products are excellent. On the other hand, as in Comparative Examples 1, 2, and 3, resin compositions of liquid crystal polyesters which are different from the present invention show that the relative dielectric constant is over a value of 3.0, and troubles of flowability at thin wall in the injection molding in Comparative Example 1 and of surface property of the product in Comparative Example 2, occurred respectively. Also, as in Comparative Example 4, in case that the melting point of the liquid crystal polyester is out of specification range of the present invention, soldering heat resistance is in worse result. Also, in Comparative Examples 5 and 6, in case that the inorganic spherical hollow material is not filled, subsequently the relative dielectric constant is over 3.0.

POSSIBILITY FOR INDUSTRIAL APPLICATION

A molded product, having a dielectric constant of 3.0 or less and a dielectric dissipation factor of 0.04 or less, which is molded by a resin composition comprising 45 to 90 percent by weight of a wholly aromatic liquid crystal polyester having a melting point of 320° C. or more, 10 to 40 percent by weight of an inorganic spherical hollow material having an aspect ratio of 2 or less, and 0 to 15 percent by weight (a total of 100 percent by weight) of an inorganic filler having an aspect ratio of 4 or more, provides suitable dielectric constant for an information transmission equipment and excellent soldering heat resistance, processability, and form stability, so that the molded product is excellent for a base material of the transmitting and receiving element fixation or the holding member of the portable wireless communications equipment.

What is claimed is:

1. A molded product comprising a dielectric constant of 3.0 or less and a dielectric dissipation factor of 0.04 or less obtained by the injection molding of a wholly aromatic liquid

TABLE 2

| | Specific Gravity of Resin Composition | Fracture Rate X | Fractured Micro Hollow Body (wt %) | (D + E)/C | Relative Dielectric Constant | Dielectric Dissipation Factor | Soldering Heat Resistance (° C.) | Surface Property of Product | Flowability Evaluation |
|---|---|---|---|---|---|---|---|---|---|
| Example 1 | 1.11 | 0.048 | 1.0 | 0.05 | 2.73 | 0.026 | 330 | ○ | ○ |
| Example 2 | 1.01 | 0.045 | 1.4 | 0.05 | 2.64 | 0.023 | 325 | ○ | ○ |
| Example 3 | 1.20 | 0.085 | 1.3 | 0.42 | 2.91 | 0.030 | 330 | ○ | ○ |
| Example 4 | 1.04 | 0.094 | 3.0 | 0.34 | 2.85 | 0.026 | 330 | ○ | ○ |
| Example 5 | 1.04 | 0.088 | 2.8 | 0.34 | 2.86 | 0.027 | 320 | ○ | ○ |
| Example 6 | 1.07 | 0.090 | 3.6 | 0.09 | 2.84 | 0.023 | 320 | ○ | ○ |
| Comparative Example 1 | 1.06 | 0.456 | 27.4 | 0.46 | 3.11 | 0.022 | 330 | X | X |
| Comparative Example 2 | 1.38 | — | — | — | 3.02 | 0.035 | 300 | X | ○ |
| Comparative Example 3 | 1.24 | 0.360 | 10.8 | 0.36 | 3.12 | 0.031 | 330 | ○ | ○ |
| Comparative Example 4 | 1.02 | 0.071 | 2.1 | 0.07 | 2.68 | 0.025 | 300 or less | ○ | ○ |
| Comparative Example 5 | 1.60 | — | — | — | 3.61 | 0.033 | 340 | ○ | ○ |
| Comparative Example 6 | 1.62 | — | — | — | 3.65 | 0.034 | 330 | ○ | ○ |

According to Table 2, the molded products of the wholly aromatic liquid crystal polyesters of the present invention (Examples) show the relative dielectric constant of 3.0 or less and the dielectric dissipation factor of 0.04 or less, and more-crystal polyester resin composition which comprises 45 to 90 percent by weight of a wholly aromatic liquid crystal polyester having a melting point of 320° C. or more, 10 to 40 percent by weight of an inorganic spherical hollow material having an aspect ratio of 2 or less, and 0 to 15 percent by weight (100 percent by weight as a total) of an inorganic filler having an aspect ratio of 4 or more, and wherein the apparent viscosity of the liquid crystal polyester at a temperature of 20° C. above the melting point of the liquid crystal polyester is 5,000 poise or less, and wherein the fracture rate X of the inorganic spherical hollow material is 0.045 to 0.094 using the following equation:

$$\rho=100/[\alpha/\rho1+\beta/\rho2+\gamma(1-X)/\rho3+\gamma X/\rho4], \text{ where in the equation:}$$

$\alpha$=the percent by weight of the wholly aromatic liquid crystal polyester resin;

$\beta$=the percent by weight of the inorganic filler having an aspect ratio of 4 or more;

$\gamma$=the percent by weight of the inorganic spherical hollow material having an aspect ratio of 2 or less;

$\rho$=the specific gravity of the wholly aromatic liquid crystal polyester resin composition;

$\rho1$=the specific gravity of the wholly aromatic liquid crystal polyester resin;

$\rho2$=the specific gravity of the inorganic filler having an aspect ratio of 4 or more;

$\rho3$=the true specific gravity of the inorganic spherical hollow material having an aspect ratio of 2 or less;

$\rho4$=the material specific gravity of the inorganic spherical hollow material;

X=the fracture rate of the inorganic spherical hollow material;

$\gamma(1-X)$=the percent by weight of non-fractured inorganic spherical hollow material;

$\gamma X$=the percent by weight of fractured inorganic spherical hollow material.

2. The molded product according to claim 1, wherein said wholly aromatic liquid crystal polyester is prepared by the polycondensation of 80 to 100 percent by mole of p-hydroxy benzoic acid (I), terephthalic acid (II), and 4,4'-dihydroxy diphenyl (III) (including the derivatives) (provided that the total of (I) and (II) is more than 60 mole percent) and 0 to 20 percent by mole of other aromatic compound which can conduct a decondensation reaction with any one of (I), (II), or (III).

3. The molded product according to claim 1, wherein the above mentioned inorganic spherical hollow material having an aspect ratio of 2 or less is an average particle diameter of 5 to 200 μm, and a rate of volume hollowness of 50 percent or more.

4. The molded product according to claim 1, wherein the inorganic filler having an aspect ratio of 4 or more is a glass fiber having an average diameter of 20 μm or less and/or talc having an average particle diameter of 100 μm or less and additionally the weight percent is in a range of 5 to 15.

5. The molded product according to claim 1, wherein the molded product comprises a portion having a thickness of 0.5 mm or less and comprising a relative dielectric constant of said portion of 3 or less.

6. The molded product according to claim 1, comprising a portable wireless telecommunications equipment having said molded product as a fixing or a holding member of a transmitting and receiving component.

7. The molded product according to claim 2, wherein:
the above mentioned inorganic spherical hollow material having an aspect ratio of 2 or less is an average particle diameter of 5 to 200 μm, and a rate of volume hollowness of 50 percent or more; and
the inorganic filler having an aspect ratio of 4 or more is a glass fiber having an average diameter of 20 μm or less and/or talc having an average particle diameter of 100 μm or less and additionally the weight percent is in a range of 5 to 15.

8. The molded product according to claim 7, comprising:
a portion of the molded product having a thickness 0.5 mm or less and comprising a relative dielectric constant of said portion of 3 or less; and
a portable wireless telecommunications equipment having said molded product as a fixing or a holding member of a transmitting and receiving component.

* * * * *

UNITED STATES PATENT AND TRADEMARK OFFICE
CERTIFICATE OF CORRECTION

PATENT NO. : 7,737,198 B2
APPLICATION NO. : 10/519046
DATED : June 15, 2010
INVENTOR(S) : Satoshi Murouchi et al.

It is certified that error appears in the above-identified patent and that said Letters Patent is hereby corrected as shown below:

Front page, (75) Inventors, "Satoshi Murouchi, Yokohama (JP);" should read --Satoshi Murouchi, Yokohama-shi (JP);--;

Front page, (75) Inventors, "Yoshikuni Yamada, Yokohama (JP)" should read --Yoshikuni Yamada, Yokohama-shi (JP)--;

Front page, (57) Abstract, line 6, "320C" should read --320°C--;

Column 7, line 12, "methos" should read --methods--;

Column 8, line 5, "can be" should read --can be used.--;

Column 10, line 37, "kouatsu" should read --Kouatsu--;

Column 10, line 52, "reactoris" should read --reactor is--;

Column 10, line 65, "kouatsu" should read --Kouatsu--; and

Column 13, Table 2, in the heading, "Body" should read --Body (E)--.

Signed and Sealed this
Twenty-eighth Day of February, 2012

David J. Kappos
*Director of the United States Patent and Trademark Office*